United States Patent [19]
Sato et al.

[11] Patent Number: 5,288,699
[45] Date of Patent: Feb. 22, 1994

[54] METHOD OF MANUFACTURING OXIDE SUPERCONDUCTING WIRE

[75] Inventors: Kenichi Sato; Takeshi Hikata, both of Osaka, Japan

[73] Assignee: Sumitomo Electric Industries, Inc., Osaka, Japan

[21] Appl. No.: 960,307

[22] Filed: Oct. 13, 1992

Related U.S. Application Data

[63] Continuation of Ser. No. 622,914, Dec. 6, 1990, abandoned.

[30] Foreign Application Priority Data

Dec. 7, 1989 [JP] Japan .................................. 1-318251
Jan. 31, 1990 [JP] Japan .................................. 2-22855

[51] Int. Cl.$^5$ ............................................. H01L 39/24
[52] U.S. Cl. ................................. 505/1; 29/599; 505/928; 505/930
[58] Field of Search .............. 29/599; 505/1, 705, 505/928, 930

[56] References Cited

U.S. PATENT DOCUMENTS 4,952,554  8/1990  Jin et al. .......................... 29/599 X

FOREIGN PATENT DOCUMENTS 0285319  10/1988  European Pat. Off. .
0296639  12/1988  European Pat. Off. .
0305820   3/1989  European Pat. Off. .

OTHER PUBLICATIONS

Yoshio Sakka et al., "Gas Adsorption and Desorption Properties of Oxide Superconducting Powder", presented at the spring meeting of Powder Metallurgy Association in Tokyo, May 31, 1981.

Hikata, T., et al., "Ag-sheathed Bi-Pb-Sr-Ca-Cu-O Superconducting wires", Japanese Journal of Applied Physics, vol. 28, No. 1, Jan. 1989, pp. L82-L84.

"Critical Current Density in Superconducting Bi-Pb-Sr-Ca-Cu-O Wires and Coils", Dou et al., Nov. 16, 1989.

Primary Examiner—Joseph M. Gorski
Attorney, Agent, or Firm—Pennie & Edmonds

[57] ABSTRACT

In a method of manufacturing an oxide superconducting wire including steps of performing heat treatment and deformation processing in a state of filling up a metal sheath with powder of an oxide superconductor or raw material therefor, fine particles or gas adsorbed by the powder can be desorbed by heating the powder at least once preferably under decompression in a stage before final sintering of the powder. It is possible to further withdraw the adsorbed fine particles or gas by heating the powder under decompression at least once before the same is covered with the sheath, covering the powder with the sheath, deforming the sheath and again heating the same under decompression, for example. Thus, it is possible to prevent gas generation from the powder during heat treatment for further growing superconductive particles, thereby preventing the superconducting wire from inflation etc. caused by such gas generation.

20 Claims, 1 Drawing Sheet

METHOD OF MANUFACTURING OXIDE SUPERCONDUCTING WIRE

This is a continuation of U.S. patent application Ser. No. 07/622,914 filed Dec. 6, 1990, now abandoned.

BACKGROUND OF THE INVENTION

Field of the Invention

The present invention relates to a method of manufacturing an oxide superconducting wire, and more particularly, it relates to an improvement for increasing critical current density and elongation workability of an oxide superconducting wire which is prepared from powder raw material for a superconductor.

Description of the Background Art

A specific material exhibits diamagnetism under a superconducting phenomenon such that no voltage potential difference is developed although a finite stationary current flows in its interior.

This superconducting phenomenon is applied to an extremely wide range of fields such as that of electric power including MHD power generation, power transmission and power storage and that of transportation including a magnetic levitation train and an electromagnetically propelled ship. Further, a supersensitive sensor for a magnetic field, a high frequency, radiation rays or the like using the superconducting phenomenon is applied to the fields of measurement including nuclear magnetic resonance (NMR), meson remedy and a high energy physical experimental apparatus, while the superconducting phenomenon is also expected in the field of electronics, which is represented by the Josephson device, as a technique which can not only reduce power consumption but implement an element of extremely high-speed operation.

Superconductivity was until recently only observed under a very low temperature. Even Nb$_3$Ge, which has been referred to as that having the highest critical temperature $T_C$ of superconductivity among conventional superconducting materials, has an extremely low critical temperature of 23.2K, and this value has been regarded as the limit critical temperature of superconductivity for a long period of time.

Therefore, a superconducting material has been generally cooled to a temperature below the aforementioned critical temperature with liquid helium which boils at 4.2 K, in order to implement a superconducting phenomenon. However, such employment of liquid helium leads to technical and economic burdens due to cooling equipment including liquefaction equipment, to hinder implementation of the superconducting technique.

On the other hand, it has been recently reported that a composite oxide sintered body can exhibit superconductivity at a high critical temperature, and development of the superconducting technique is abruptly being prompted with a superconductor whose critical temperature is not very low. It has been reported and recognized that a YBaCuO material superconducts at 90K, and BiSrCaCuO and BiPbSrCaCuO materials superconduct at 110K, respectively.

In order to manufacture a wire by the aforementioned composite oxide sintered body, i.e., an oxide superconductor, the following method has been tried, for example: First, powder is prepared by repeating a step of heating an oxide superconductor or raw material therefor and thereafter pulverizing the same a plurality of times. This powder is then covered with a sheath of a metal or an alloy which is unreactive and nonreductional with respect to the powder at a temperature of not more than 950° C. The sheath thus filled up with the powder is so deformed that its diameter is reduced. An elongated wire is obtained in this stage. Then, this wire is heat treated.

FIG. 1 shows a superconducting wire 1 obtained in the aforementioned manner. This superconducting wire 1 comprises a superconducting part 2 of an oxide superconductor, and a sheath 3 formed to enclose the superconducting part 2. The sheath 3 is made of silver or a silver alloy, for example.

In the aforementioned method of manufacturing an oxide superconducting wire, however, the powder of the oxide superconductor or raw material therefor may generate gas during heat treatment of the wire obtained by deformation processing, such that a void 4 is defined in the superconducting part 2 to inflate the sheath 3, as shown in FIG. 2. If such inflation is caused in the superconducting wire 1, its critical current density $J_c$ is reduced. In order to increase critical current density of the superconducting wire 1, therefore, it is necessary to prevent such inflation in the superconducting part 2.

In general, the aforementioned inflation in the superconducting part 2 is not uniformly caused longitudinally along the superconducting wire 1, but ununiformly distributed in a plurality of portions along the longitudinal direction. If such inflation takes place, therefore, it is difficult to obtain a superconducting wire which has small distribution of critical current density $J_c$ along the longitudinal direction.

SUMMARY OF THE INVENTION

Accordingly, an object of the present invention is to provide a method of manufacturing an oxide superconducting wire, which can solve the problem of inflation of a superconducting part, thereby providing high critical current density.

Another object of the present invention is to provide a method of manufacturing an oxide superconducting wire with smaller dispersion of critical current density along the longitudinal direction.

The inventive method of manufacturing an oxide superconducting wire comprises:

(1) a step of preparing powder by repeating heat treatment and pulverization of an oxide superconductor or raw material therefor a plurality of times:

(2) a step of covering the powder with a sheath of a metal or an alloy which is unreactive and nonreductional with respect to the powder at a temperature of not more than 950° C;

(3) a step of deforming the sheath which is filled up with the powder; and (4) a step of heat treating a wire obtained by the deforming step.

In order to solve the aforementioned technical problem, the present invention further comprises a step of re-heating the powder between the step (1) of preparing powder and the step (2) of covering the powder with a sheath.

After the aforementioned re-heating step, a process of softly pulverizing the powder to an extent allowing no adsorption of gas nor fine particles may be introduced within the scope of the present invention.

In another aspect of the present invention, the inventive method comprises a process of heating the powder under a decompressed atmosphere of not more than 850° C. in at least part of the heat treatment included in the step (1) of preparing powder and/or part of the step (4) of heat treating the wire, in order to solve the aforementioned problem.

More preferably, the inventive method may further include a step of heating the powder under a decompressed atmosphere of not more than 850° C. between the step (1) of preparing powder and the step (2) of covering the powder with a sheath.

After the aforementioned heating step is carried out in advance of the step (2), a process of softly pulverizing the powder to an extent allowing no adsorption of gas nor fine particles may be introduced within the scope of the present invention.

The sheath is preferably formed of silver or a silver alloy.

The oxide superconductor is preferably prepared from BiPbSrCaCuO, BiSrCaCuO, TlBaCaCuO, TlBiSrCaCuO, TlPbBaCaCuO or TlPbSrCaCuO oxide superconductor material.

According to the present invention, fine particles or gas adsorbed by the powder can be desorbed by heating the powder at least once preferably under decompression in a stage before final sintering of the powder. The adsorbed fine particles or gas can be further withdrawn by heating the powder under decompression at least once before the same is covered with the sheath, then covering the powder with the sheath, deforming the sheath and again heating the same under decompression, for example. Thus, it is possible to prevent gas generation from the powder during heat treatment for growing superconductive particles, thereby preventing the superconducting wire from inflation etc. caused by such gas generation.

Thus, according to the present invention, the superconducting wire can be prevented from inflation so that no cracking etc. is caused in a superconducting part which is provided in the superconducting wire. Thus, a cause for reduction of critical current density can be eliminated, whereby it is possible to obtain an oxide superconducting wire which can provide high critical current density, as well as to extremely reduce dispersion of critical current density along the longitudinal direction of the superconducting wire.

Thus, the oxide superconducting wire according to the present invention is particularly effectively applicable to a magnet coil or a superconducting cable, which is prepared from an elongated wire.

These and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Powder was prepared by mixing $Bi_2O_3$, PbO, $SrCO_3$, $CaCO_3$ and CuO so that Bi, Pb, Sr, Ca and Cu were in composition ratios of 1.8:0.4:2:2.2:3.

This powder was heat treated at 800° C. for eight hours, and then the heat-treated substance was pulverized into powder in an automatic mortar for two hours. Thereafter the pulverized substance was heat treated at 860° C. for eight hours, and then the heat-treated substance was again pulverized into powder similarly to the above. This powder was divided into halves, and treated as follows:

The first half was directly filled up in a silver pipe of 6 mm in outer diameter and 4 mm in inner diameter and then subjected to wire drawing and rolling, to prepare a tape-type wire of 0.2 mm in thickness (wire 1).

The second half was again heated at 800° C. for 15 minutes, and then filled up in a silver pipe which was similar to the above, and worked into a wire by a similar technique (wire 2).

Figure 1:
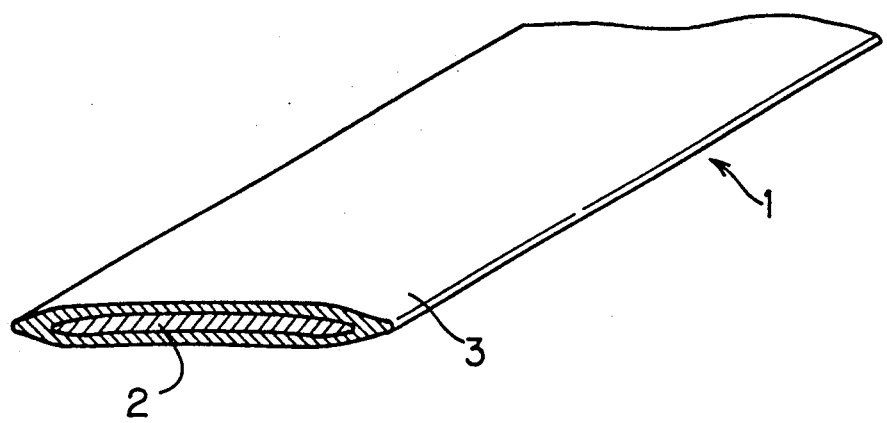
FIG. 1 is a perspective view showing a part of an oxide superconducting wire 1 to be obtained according to the present invention.
Figure 2:
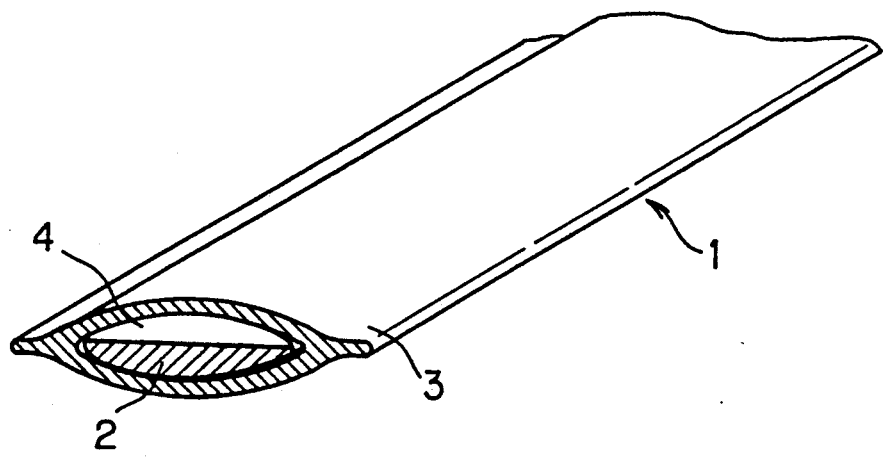
FIG. 2 is a perspective view showing a part of an undesirably inflated oxide superconducting wire 1.

The as-formed wires 1 and 2 were heat treated in the atmospheric air at 845° C. for 50 hours. As the result, the wire 1 was inflated as shown in FIG. 2, while no inflation was caused in the wire 2, as shown in FIG. 1. The inflated wire 1 substantially passed no current, while the wire 2 exhibited critical current density of 12500 $A/cm^2$ in liquid nitrogen (77.3K). Table 1 shows states of distribution of critical current density in ranges of 5 m along longitudinal directions of the wires 1 and 2. As understood from Table 1, dispersion of critical current density of the wire 2 was within about 20%.

TABLE 1

| | Wire 1 | Wire 2 |
|---|---|---|
| Longitudinal Distribution Along Wires | | |
| 1 [m] | 100 $A/cm^2$ | 11500 $A/cm^2$ |
| 2 | 50 $A/cm^2$ | 12500 $A/cm^2$ |
| 3 | 0 $A/cm^2$ | 11000 $A/cm^2$ |
| 4 | 120 $A/cm^2$ | 12100 $A/cm^2$ |
| 5 | 30 $A/cm^2$ | 10800 $A/cm^2$ |
| Dispersion | 100% | 20% |

Example 2

The wires 1 and 2 obtained in Example 1 were further rolled to be 0.15 mm in thickness, and then heat treated at 840° C. Table 2 shows states of distribution of critical current density of the wires 1 and 2. As understood from Table 2, the wire 2 exhibited superior results with respect to dispersion of critical current density.

TABLE 2

| Longitudinal Distribution Along Wires | Wire 1 | Wire 2 |
|---|---|---|
| 1 [m] | 5000 $A/cm^2$ | 15000 $A/cm^2$ |
| 2 | 1000 $A/cm^2$ | 14500 $A/cm^2$ |
| 3 | 0 $A/cm^2$ | 16000 $A/cm^2$ |
| 4 | 1500 $A/cm^2$ | 15400 $A/cm^2$ |
| 5 | 2300 $A/cm^2$ | 15100 $A/cm^2$ |

EXAMPLE 3

Powder was prepared by mixing $Bi_2O_3$, PbO, $SrCO_3$, $CaCO_3$ and CuO so that Bi, Pb, Sr, Ca and Cu were in composition ratios of 1.8:0.4:2:2.2:3.

This powder was heat treated at 800° C. for eight hours, and the heat-treated substance was pulverized into powder in an automatic mortar for two hours. Thereafter the pulverized substance was heat treated at 860° C. for eight hours, and then the heat-treated substance was again pulverized into powder similarly to the above. This powder was divided into halves, and treated as follows:

The first half was filled up in a silver pipe of 6 mm in outer diameter and 4 mm in inner diameter for serving as a sheath, and then subjected to wire drawing and rolling, to prepare a tape-type wire of 0.2 mm in thickness (wire 3).

The second half was again heated under decompression of 20 Torr at 700° C. for 30 minutes, and thereafter filled up in a silver pipe which was similar to the above, and worked into a wire by a similar technique (wire 4).

The as-formed wires 3 and 4 were heat treated in the atmospheric air at 845° C. for 50 hours. As the result, the wire 3 was inflated as shown in FIG. 2, while no inflation was caused in the wire 4, as shown in FIG. 1. The inflated wire 3 substantially passed no current, while the wire 4 exhibited critical current density of 12500 A/cm$^2$ in liquid nitrogen (77.3K). Table 3 shows states of distribution of critical current density in ranges of 5 m along longitudinal directions of the wires 3 and 4. As understood from Table 3, dispersion of critical current density was within about 20% in the wire 4.

TABLE 3

|  | Wire 3 | Wire 4 |
| --- | --- | --- |
| Longitudinal Distribution Along Wires | | |
| 1 [m] | 100 A/cm$^2$ | 12000 A/cm$^2$ |
| 2 | 50 A/cm$^2$ | 12300 A/cm$^2$ |
| 3 | 0 A/cm$^2$ | 15000 A/cm$^2$ |
| 4 | 120 A/cm$^2$ | 13200 A/cm$^2$ |
| 5 | 30 A/cm$^2$ | 14000 A/cm$^2$ |
| Dispersion | 100% | 20% |

EXAMPLE 4

The wires 3 and 4 obtained in Example 3 were further rolled to be 0.15 mm in thickness, and then heat treated at 840° C. Table 4 shows states of distribution of critical current density of the wires 3 and 4. As understood from Table 4, the wire 4 exhibited superior results as to dispersion of critical current density.

TABLE 4

| Longitudinal Distribution Along Wires | Wire 3 | Wire 4 |
| --- | --- | --- |
| 1 [m] | 5000 A/cm$^2$ | 20000 A/cm$^2$ |
| 2 | 1000 A/cm$^2$ | 18500 A/cm$^2$ |
| 3 | 0 A/cm$^2$ | 21200 A/cm$^2$ |
| 4 | 1500 A/cm$^2$ | 19400 A/cm$^2$ |
| 5 | 2300 A/cm$^2$ | 18700 A/cm$^2$ |

Example 5

The wires 3 and 4 obtained in Example 3 by wire drawing and rolling were heated under decompression of 20 Torr at 700° C. for 30 minutes, thereafter sintered in the atmospheric air at 845° C. for 50 hours, and subjected to the working and heat treatment mentioned in relation to Example 4. As the result, no inflation was caused in the wire 3, which had been inflated in Example 3. As shown in Table 5, the wire 3 exhibited higher critical density as compared with Examples 3 and 4, with smaller dispersion. The wire 4 also exhibited higher critical current density as compared with Examples 3 and 4, with smaller dispersion.

TABLE 5

| Longitudinal Distribution Along Wires | Wire 3 | Wire 4 |
| --- | --- | --- |
| 1 [m] | 1100 A/cm$^2$ | 28000 A/cm$^2$ |
| 2 | 8000 A/cm$^2$ | 26000 A/cm$^2$ |
| 3 | 5600 A/cm$^2$ | 29000 A/cm$^2$ |
| 4 | 7000 A/cm$^2$ | 27000 A/cm$^2$ |
| 5 | 10300 A/cm$^2$ | 29000 A/cm$^2$ |

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a high $T_c$ copper oxide superconducting wire, comprising:
   a step of preparing powder by repeating heat treatment and pulverization of a high T copper oxide superconductor a plurality of times;
   a step of covering said powder with a sheath of a metal or a metal ally being unreactive with respect to said powder at a temperature of not more than 950° C.;
   a step of deforming said sheath;
   a step of heat treating a wire obtained by said step of deforming said sheath, and
   said method further including a step of desorbing gas from said powder between said step of preparing powder and said step of covering said powder with a sheath so that no inflation of said wire is caused by gas in said step of heat treating said wire.

2. A method of manufacturing a high $T_c$ copper oxide supercondcting wire in accordance with claim 1, wherein said sheath is silver or silver alloy.

3. A method of manufacturing an oxide superconducting wire in accordance with claim 1, wherein said oxide superconductor is prepared from one of BiPbSrCaCuO, BiSrCaCuO, TlBaCaCuO, TlBiSrCaCuO, TlPbBaCaCuO and TlPbSrCaCuO oxide superconductor materials.

4. A method of manufacturing a high $T_c$ copper oxide superconducting wire in accordance with claim 1, wherein said step of desorbing gas from said powder is by reheating said powder at a temperature of at least 700° C. and not more than 850° C.

5. A method of manufacturing a high $T_c$ copper oxide superconducting wire, comprising:
   a step of preparing powder by repeating heat treatment and pulverization of a high $T_c$ copper oxide superconductor a plurality of times;
   a step of covering said powder with a sheath of a metal or a metal alloy being unreactive with respect to said powder at a temperature of not more than 950° C.;
   a step of deforming said sheath;
   a step of heat treating a wire obtained by said step of deforming said sheath, and
   said method further including a process of desorbing gas from said powder by heating said powder under a decompressed atmosphere at a temperature of not more than 850° C. so that no inflation of said wire is caused by gas in said step of heat treating said wire.

6. A method of manufacturing a high $T_c$ copper oxide superconducting wire in accordance with claim 5, wherein said sheath is silver or silver alloy.

7. A method of manufacturing a high $T_c$ copper oxide superconducting wire in accordance with claim 5, wherein said process of desorbing gas from said powder comprises heating said powder under a decompressed atmosphere of 20 Torr. and a temperature of at least 700° C. and not more than 850° C. between said step of preparing powder and said step of covering said powder with a sheath.

8. A method of manufacturing a high $T_c$ copper oxide superconducting wire in accordance with claim 5, wherein said process of desorbing gas from said powder occurs in at least part of said heat treatment included in said step of preparing powder and part of said step of heat treating said wire.

9. A method of manufacturing a high $T_c$ copper oxide superconducting wire in accordance with claim 5, wherein said process of desorbing gas from said powder occurs in at least part of said heat treatment included in said step of preparing powder.

10. A method of manufacturing a high $T_c$ copper oxide superconducting wire in accordance with claim 5, wherein said process of desorbing gas from said powder occurs in at least part of said step of heat treating said wire.

11. A method of manufacturing a high $T_c$ copper oxide superconducting wire, comprising:
a step of preparing powder by repeating heat treatment and pulverization of raw material for a high $T_c$ copper oxide superconductor a plurality of times;
a step of covering said powder with a sheath of a metal or a metal alloy being unreactive with respect to said powder at a temperature of not more than 950° C.;
a step of deforming said sheath;
a step of heat treating a wire obtained by said step of deforming said sheath, and
said method further including a step of desorbing gas from said powder between said step of preparing powder and said step of covering said powder with a sheath so that no inflation of said wire is caused by gas in said step of heat treating said wire.

12. A method of manufacturing a high $T_c$ copper oxide superconducting wire in accordance with claim 11, wherein said sheath is silver or silver alloy.

13. A method of manufacturing a high $T_c$ copper oxide superconducting wire in accordance with claim 11, wherein said raw material for a high $T_c$ copper oxide superconductor is capable of being formed into a superconductor material comprising BiPbSrCaCuO, BiSrCaCuO, TlBaCaCuO, TlBiSrCaCuO, TlPbBaCaCuO and TlPbSrCaCuO.

14. A method of manufacturing a high $T_c$ copper oxide superconducting wire in accordance with claim 11, wherein said step of desorbing gas from said powder is by reheating said powder at a temperature of at least 700° C. and not more than 850° C.

15. A method of manufacturing a high $T_c$ copper oxide superconducting wire, comprising:
a step of preparing powder by repeating heat treatment and pulverization of a high $T_c$ copper oxide superconductor a plurality of times;
a step of covering said powder with a sheath of a metal or a metal alloy being unreactive with respect to said powder at a temperature of not more than 950° c.;
a step of deforming said sheath;
a step of heat treating a wire obtained by said step of deforming said sheath, and
said method further including a process of desorbing gas from said powder by heating said powder under a decompressed atmosphere at a temperature of not more than 850° c. so that no gas is adsorbed by said powder upon said step of heat treating said wire and so that no inflation of said wire is caused by gas in said step of heat treting said wire.

16. A method of manufacturing a high $T_c$ copper oxide superconducting wire in accordance with claim 15, wherein said sheath is silver or silver alloy.

17. A method of manufacturing a high $T_c$ copper oxide superconducting wire in accordance with claim 15, wherein said process of desorbing gas from said powder comprises heating said powder under a decompressed atmosphere of 20 Torr and a temperature of at least 700° C. and not more than 850° C. between said step of preparing powder and said step of covering said powder with a sheath.

18. A method of manufacturing a high $T_c$ copper oxide superconducting wire in accordance with claim 15, wherein said process of desorbing gas from said powder occurs in at least part of said heat treatment included in said step of preparing powder and part of said step of heat treating said wire.

19. A method of manufacturing a high $T_c$ copper oxide superconducting wire in accordance with claim 15, wherein said process of desorbing gas from said powder occurs in at least part of said heat treatment included in said step of preparing powder.

20. A method of manufacturing a high $T_c$ copper oxide superconducting wire in accordance with claim 15, wherein said process of desorbing gas from said powder occurs in at least part of said step of heat treating said wire.

* * * * *